United States Patent [19]

Akagawa

[11] Patent Number: 5,073,079
[45] Date of Patent: Dec. 17, 1991

[54] MODULAR LOADING-UNLOADING SYSTEM FOR INTEGRATED CIRCUITS OR THE LIKE

[75] Inventor: Minoru Akagawa, Fremont, Calif.

[73] Assignee: Intelmatec Corporation, Fremont, Calif.

[21] Appl. No.: 525,338

[22] Filed: May 17, 1990

[51] Int. Cl.[5] .............................................. B25J 9/02
[52] U.S. Cl. ..................................... 414/416; 414/751
[58] Field of Search ............... 414/416, 749, 750, 752, 414/751; 901/16, 21

[56] References Cited

U.S. PATENT DOCUMENTS

| | | | |
|---|---|---|---|
| 3,884,363 | 5/1975 | Ajlouny | 901/16 X |
| 4,586,247 | 5/1986 | Murai et al. | 414/750 X |
| 4,699,559 | 10/1987 | Bibbo et al. | 414/752 |
| 4,836,111 | 6/1989 | Kaufmann | 901/16 X |

FOREIGN PATENT DOCUMENTS

| | | | |
|---|---|---|---|
| 0169420 | 7/1986 | Japan | 901/16 |
| 2120202 | 11/1983 | United Kingdom | 901/16 |

Primary Examiner—Robert J. Spar
Assistant Examiner—James Keenan
Attorney, Agent, or Firm—Heller, Ehrman, White & McAuliffe

[57] ABSTRACT

A system can be formed for automatically loading and unloading items such as ICs into and from containers of different types having various configurations by providing a plurality of base units each of the same structure but having different item-handling modules attached thereto. The base units have a unistructurally cast planar top plate with a horizontal top surface, an arm which is horizontally supported above the top plate and a driving assembly which serves to move the arm in a horizontal first direction while the arm remains extended in a horizontal second direction perpendicular to the first direction. A holder member is mounted to the arm and slidable therealong in the second direction. A spline shaft is rotatably supported by the top plate that extends in the first direction. A belt is attached to the holder member on the arm and engages with the spline shaft in a power-communication relationship. The belt is slidable along the spline shaft such that, as the spline shaft rotates, the belt can pull the holder member in the second direction independently of the position or motion of the arm in the first direction. Different types of item-handling modules are attached to the individual units for particular loading and unloading operations.

8 Claims, 8 Drawing Sheets

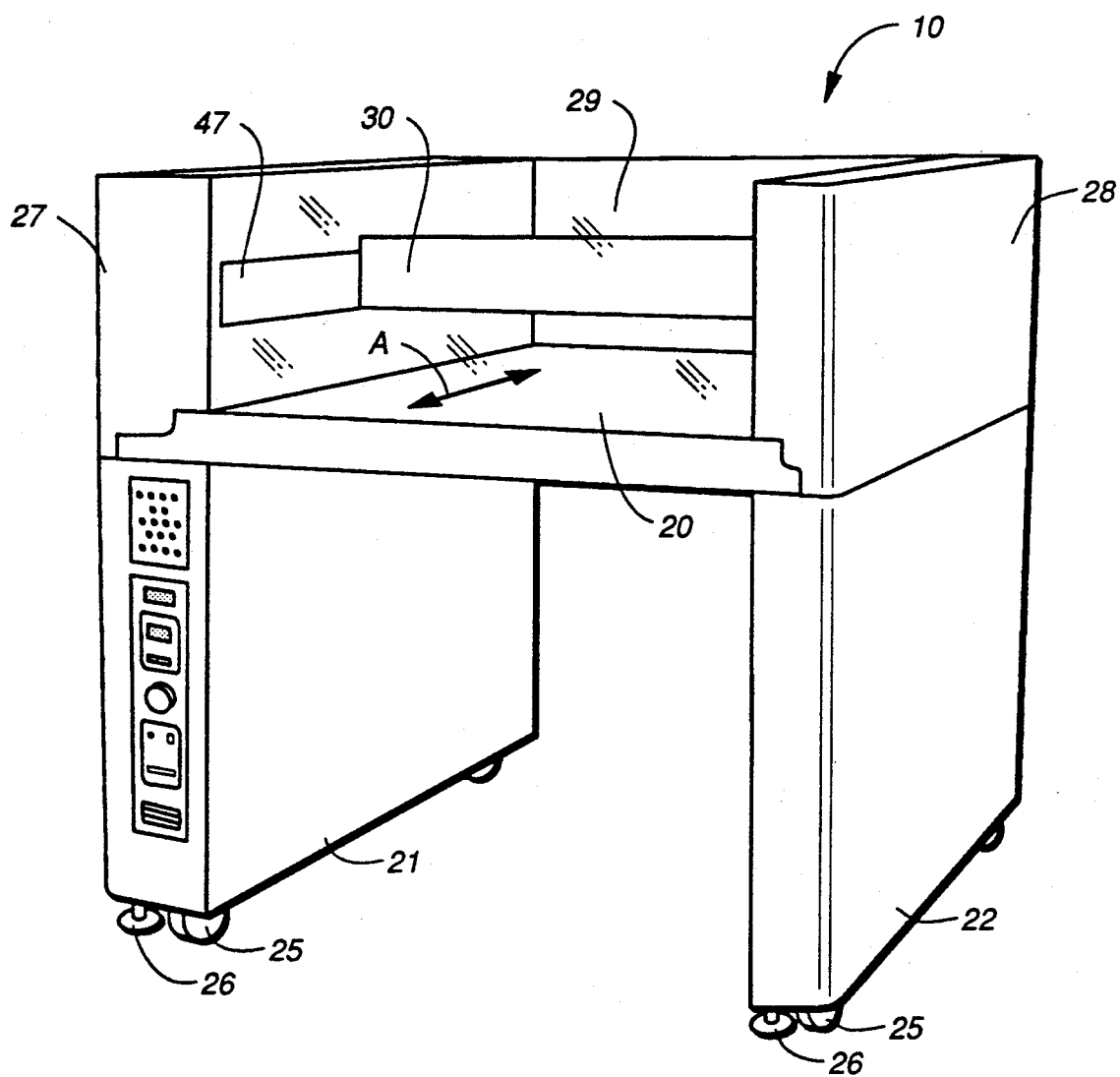
FIG._1

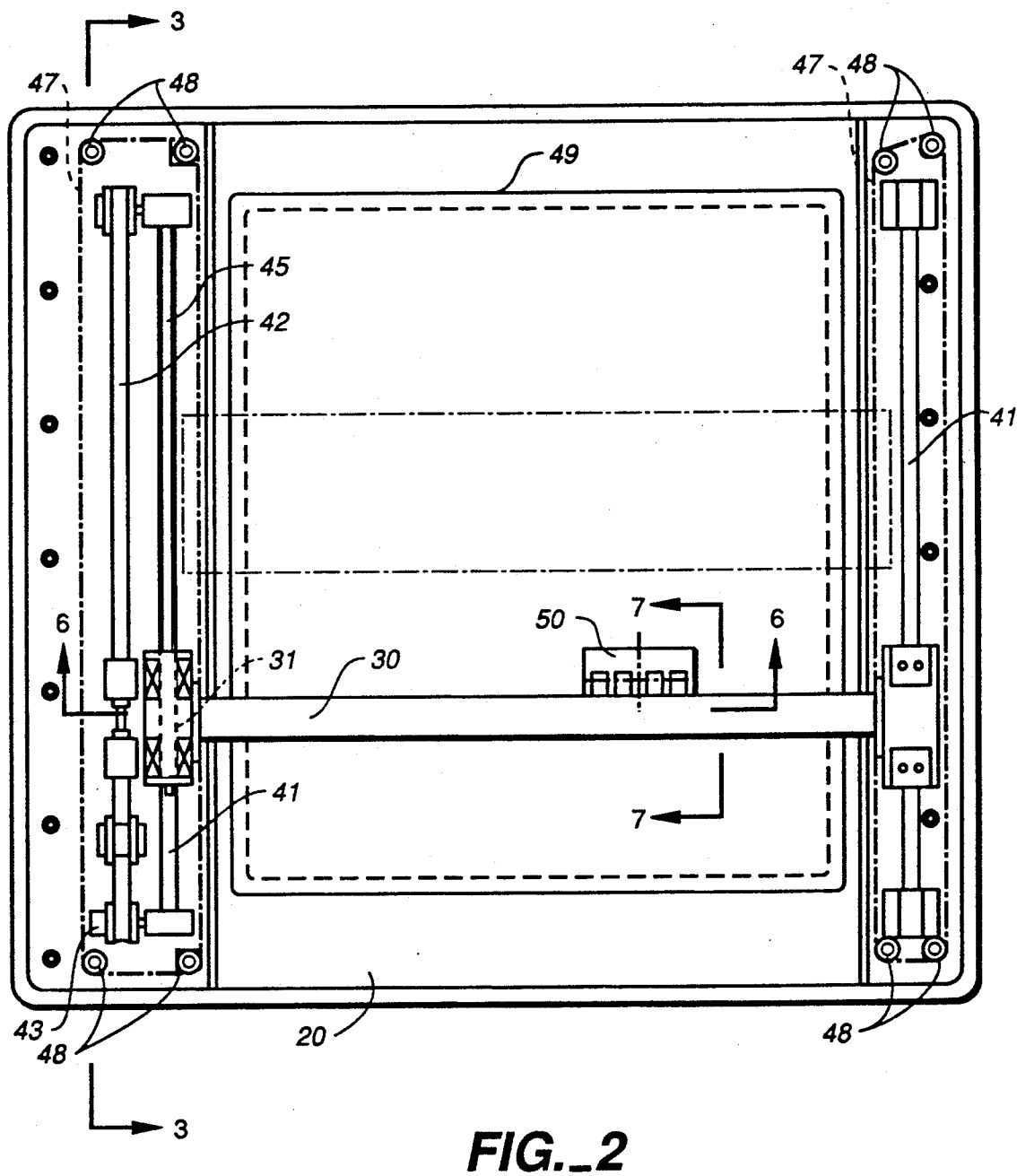
FIG._2

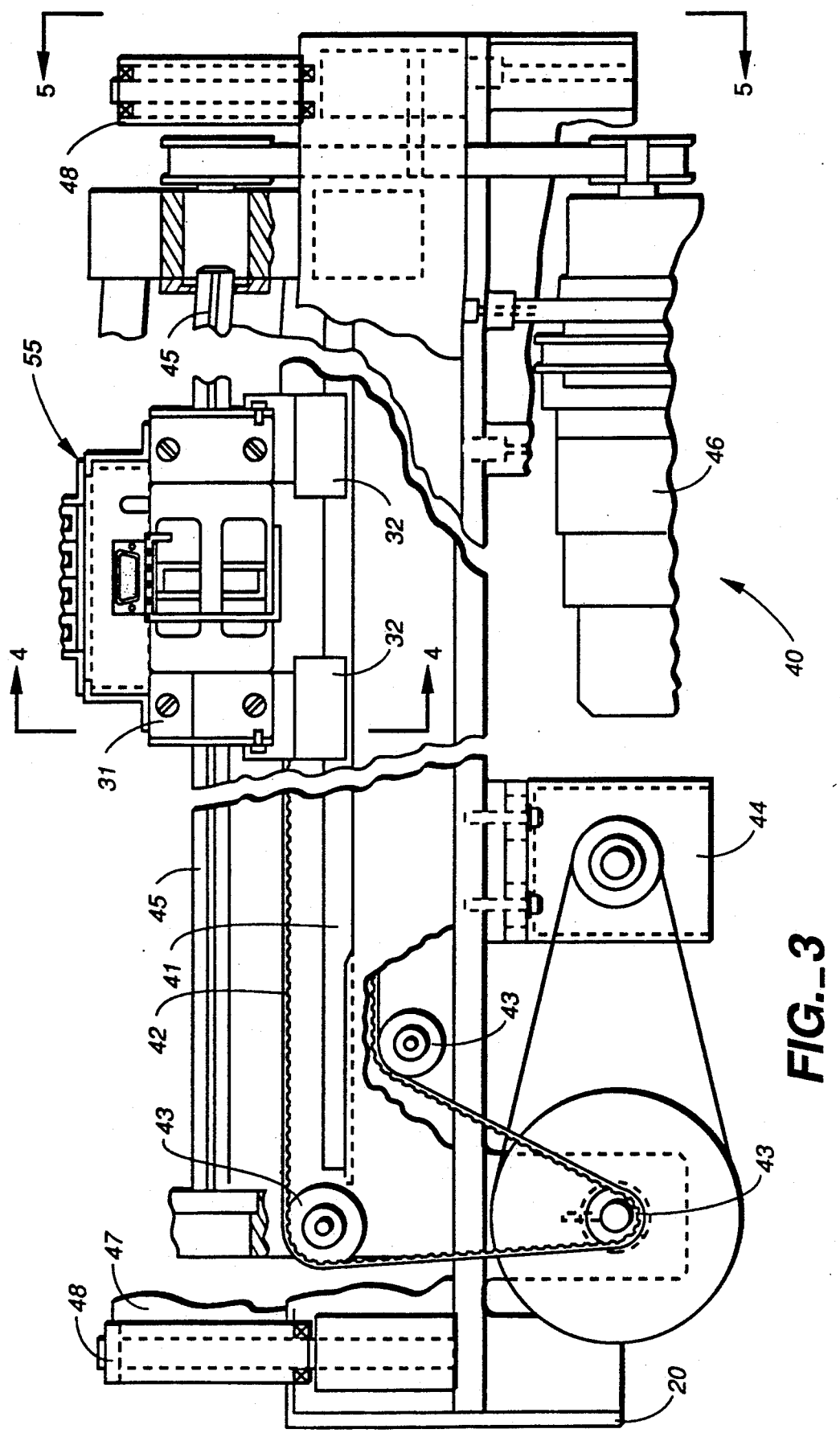
FIG._3

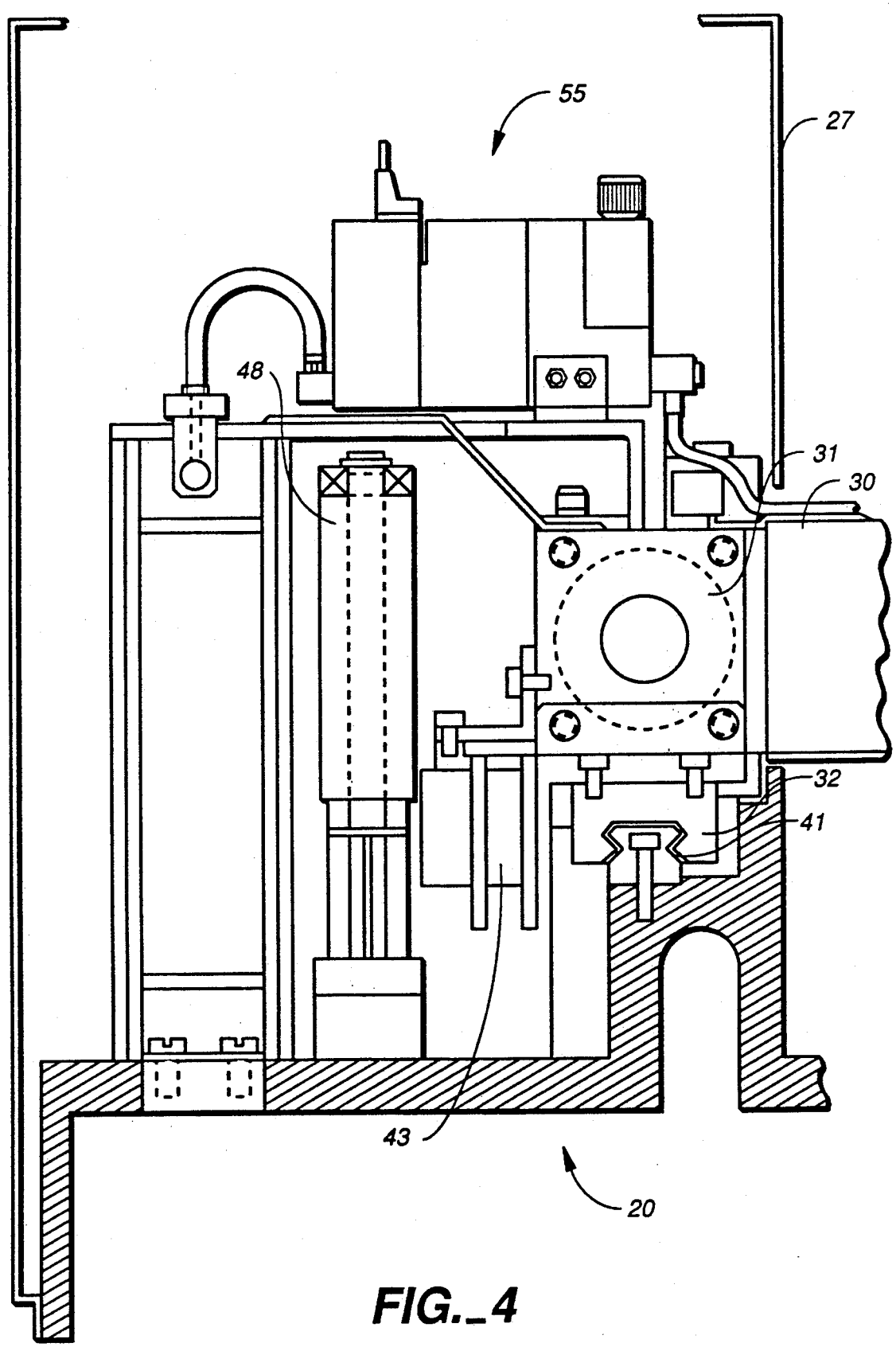
FIG._4

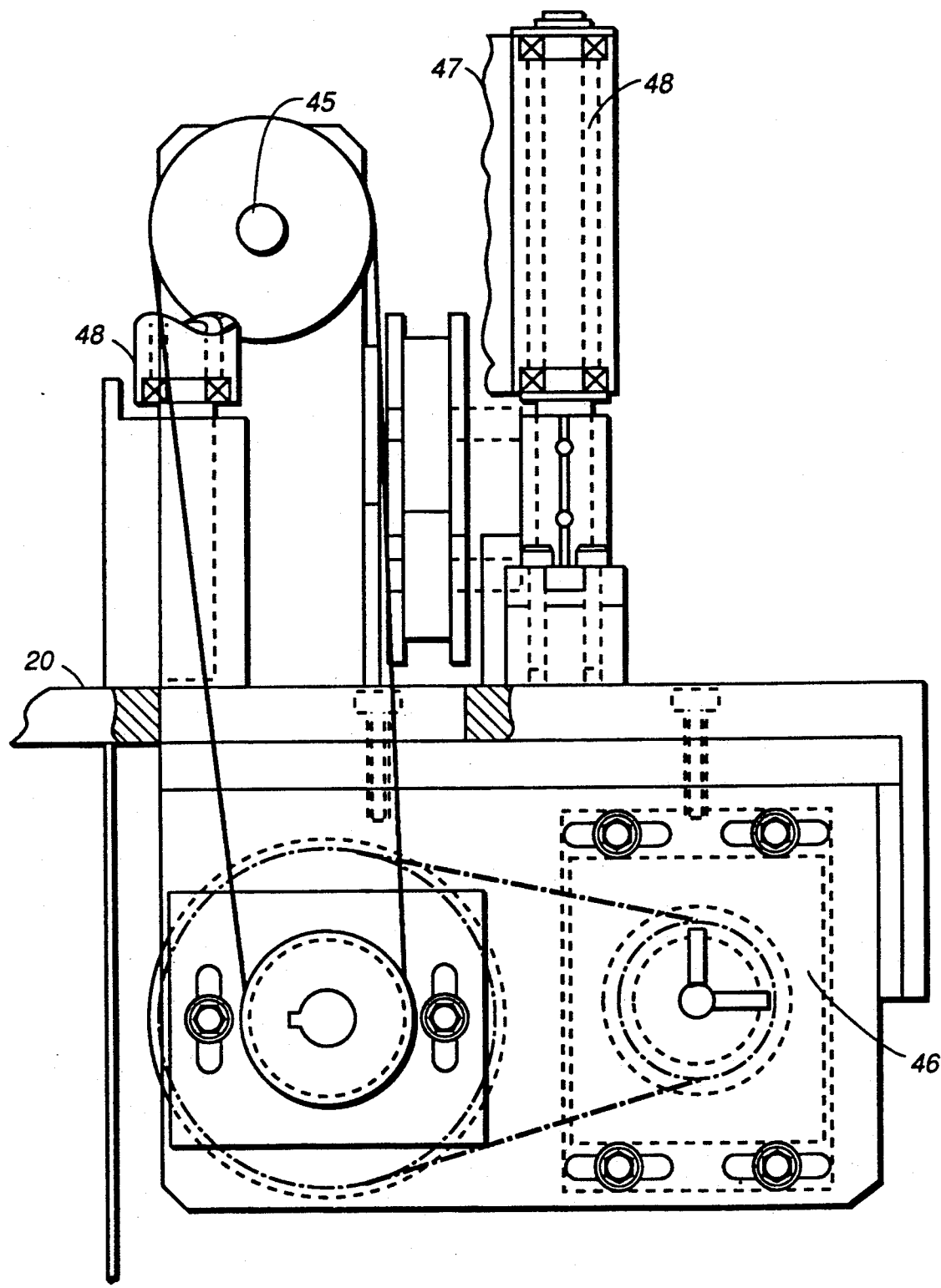
FIG._5

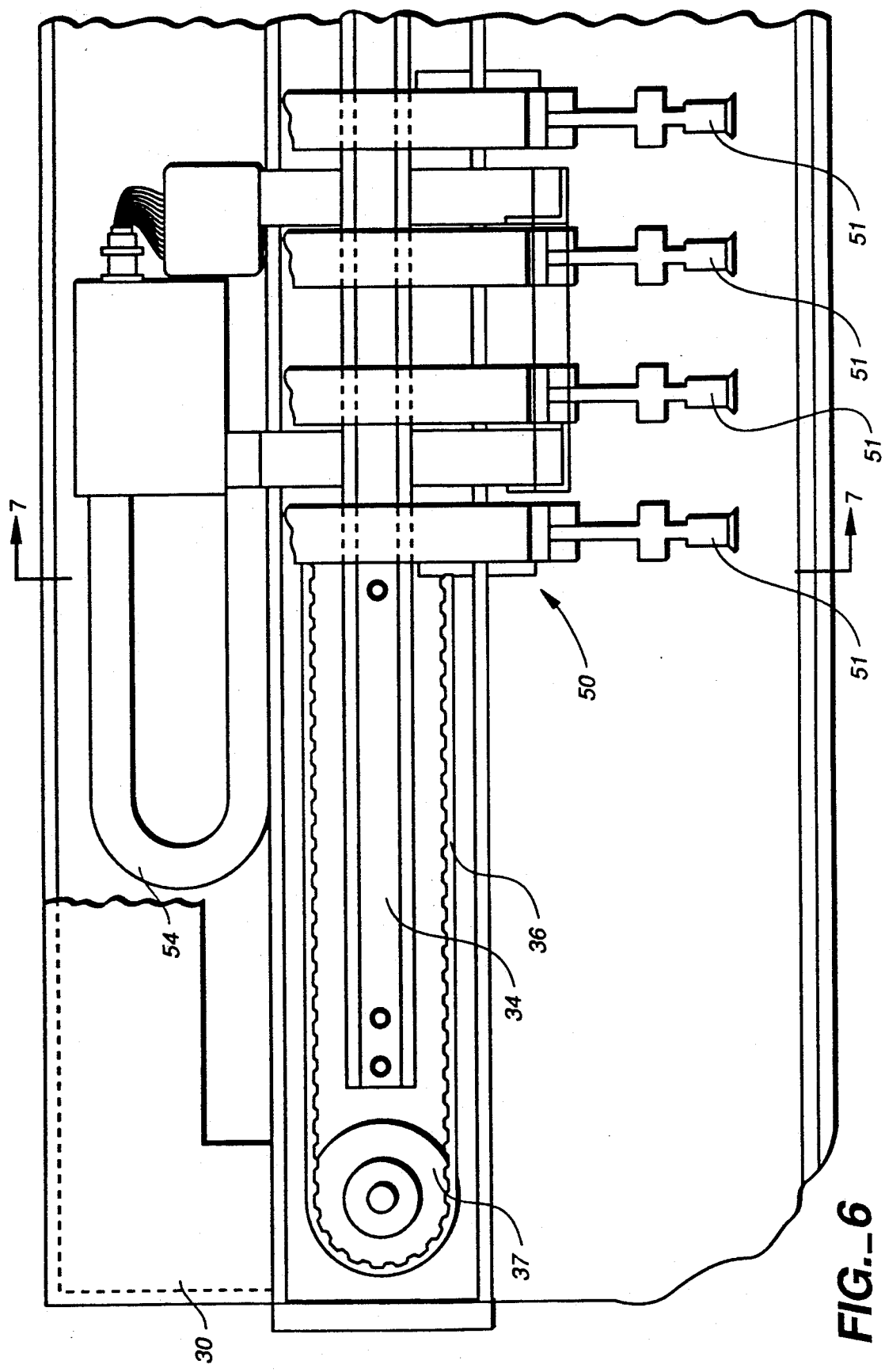
FIG._6

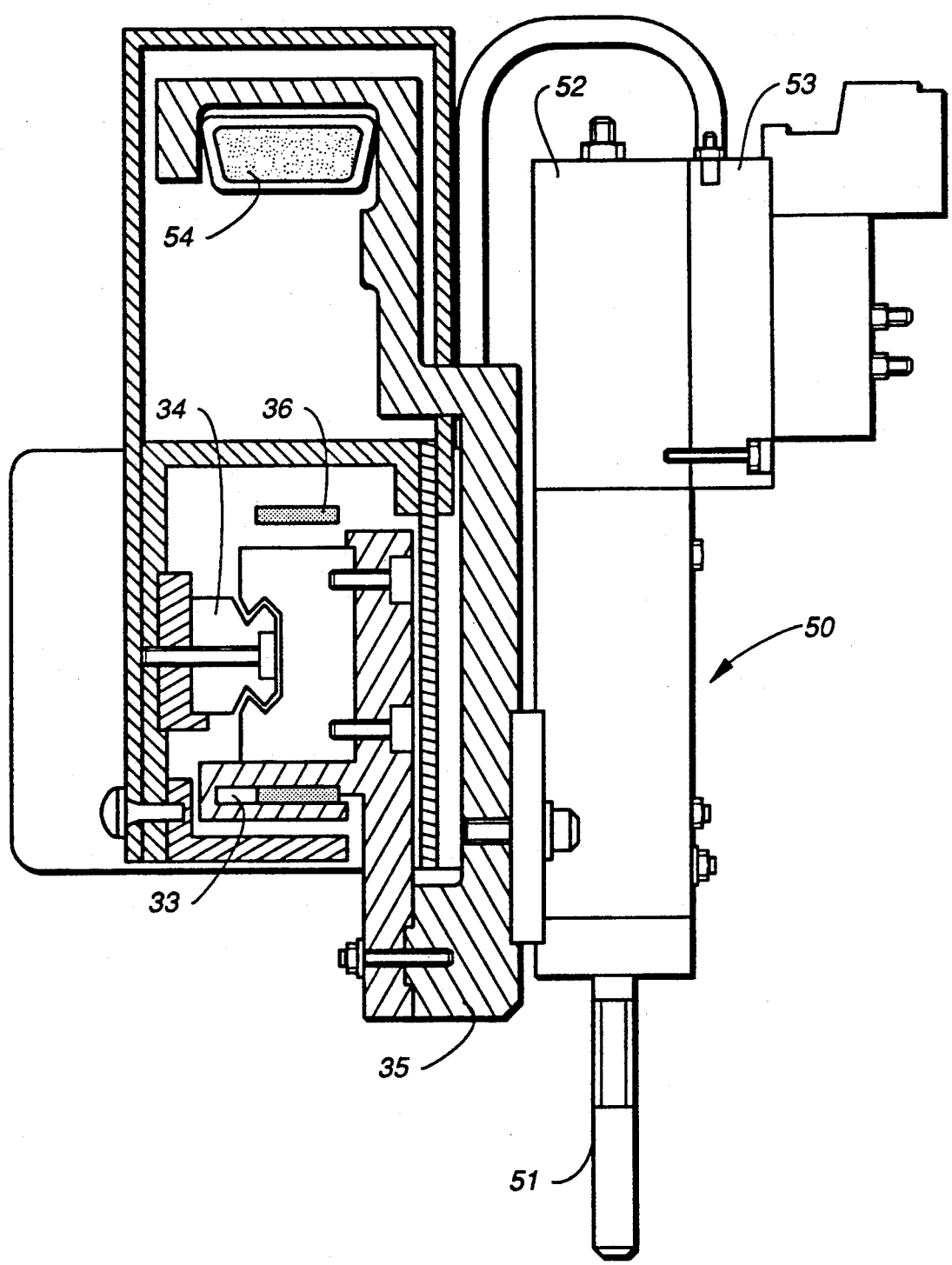
FIG._7

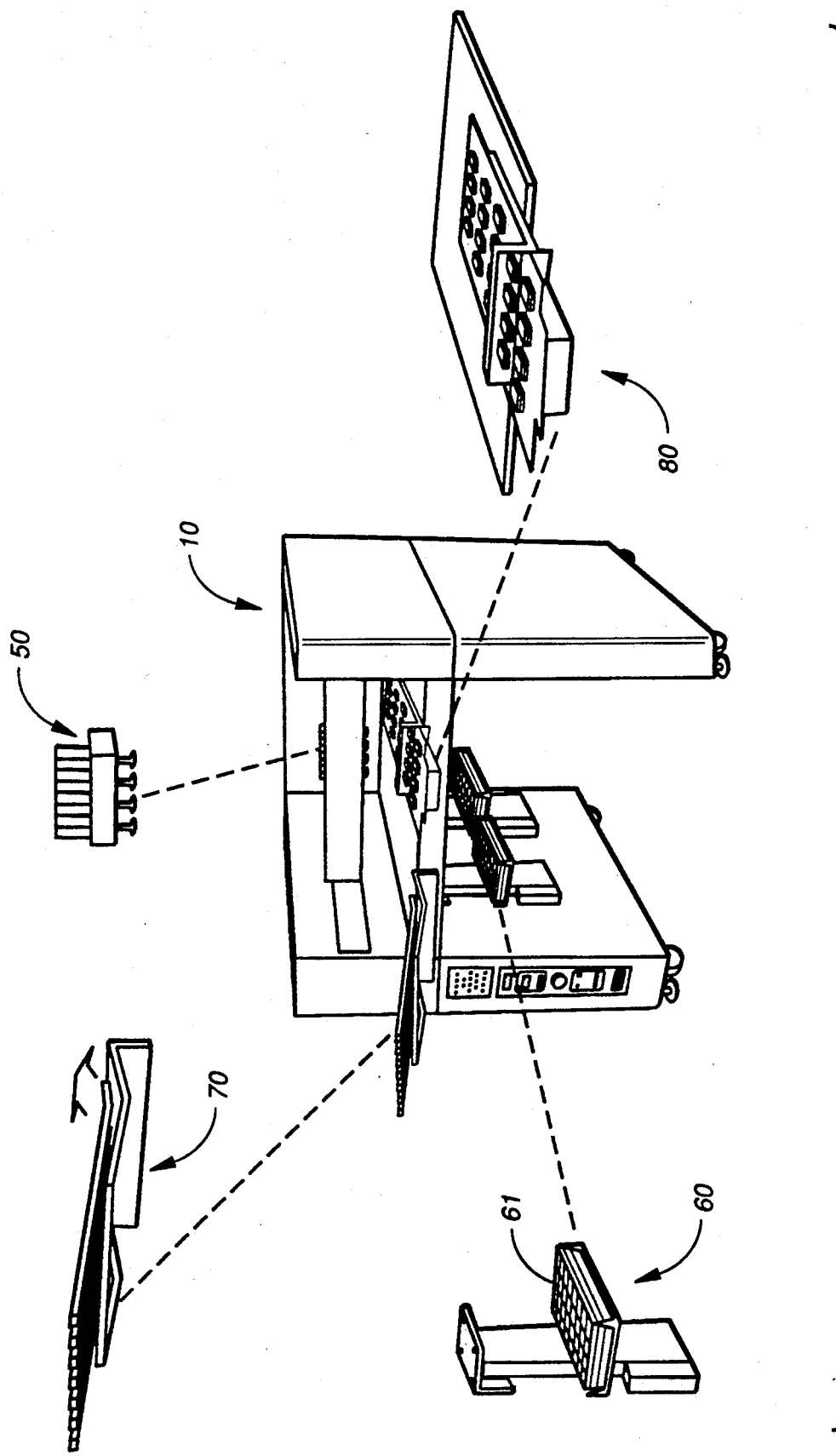
FIG._8

MODULAR LOADING-UNLOADING SYSTEM FOR INTEGRATED CIRCUITS OR THE LIKE

BACKGROUND OF THE INVENTION

This invention relates to a system for loading and unloading small items such as integrated circuits (ICs) and a driver assembly which may be conveniently incorporated in such a system. More particularly, this invention relates to a modular system comprised of a plurality of units for automatically carrying out such operations.

When ICs are produced, they are taken to different work stations to go through numerous production and testing processes, and "vehicles" of many different types are used to transport them to and from such work stations. Examples of such vehicles include trays, elevators and tubes. In the past, ICs were manually loaded into and unloaded from these vehicles. With the continuing miniaturization of ICs and increase in the degree of their integration, however, such manual operations are not only inefficient but tend to adversely affect the quality of the products. To automate the loading and unloading processes is desirable but, since there are so many different types of vehicles which are used in the production and testing processes, it is too expensive and impractical to provide a specifically designed automatic loading-unloading apparatus for vehicles of each kind.

SUMMARY OF THE INVENTION

It is therefore an object of the present invention to provide a system with which small items such as ICs can be loaded into and unloaded from various configurations of trays, tubes and other means of transportation from one processing place to another.

It is another object of the present invention to provide such a system which is suited for automatic operations.

It is still another object of the present invention to provide such a system that can be constructed inexpensively.

It is a further object of the present invention to provide a driver assembly with which means for handling the items to be loaded and/or unloaded by a system of the present invention can be effectively transported controllably to specified positions. The above and other objects of the present invention can be achieved by providing a system comprised of a plurality of modular units which are basically the same in structure but each of which is equipped with a different item-handling module or a different set of such modules so as to be able to efficiently unload items such as ICs from a vehicle of a first specified type and load them into another vehicle of a second specified type. This basic structure which is common to all these modular units is hereinafter referred to as the base unit. The base unit according to the present invention is of a modular structure including a unistructurally cast planar piece supported horizontally and an elongated arm assembly is supported above this planar piece such that it can move in one direction (forward-backward direction) while remaining extended horizontally in a perpendicular direction (transverse direction). A structure hereinafter referred to as the holder member is mounted to this arm assembly so as to be slidingly movable therealong, that is, horizontally in the transverse direction. The holder member is so called because it serves to hold, or support a module for lifting up a small item. Thus, by moving the transversely extending arm assembly in the forward-backward direction and the holder member in the transverse direction on and along this arm assembly, the module for lifting up items can be brought to any two-dimensional position above the planar piece.

According to a preferred embodiment of the present invention, the arm assembly is supported by and moves on two rails which are fastened directly onto the planar piece. A motor attached to the planar piece serves to drive the arm assembly through a pulley-and-belt system. To drive the holder member transversely along the arm assembly, there is provided a spline shaft parallel to the rails, that is, in the forward-backward directions and another motor also attached to the planar piece serves to rotate this spline shaft around its own axis. The arm assembly has an end structure through which the spline shaft penetrates as the arm assembly may be moved in the forward-backward direction on the rails. Another pulley-and-belt system is mounted to the arm assembly and attached to the holder member such that the rotary motion of the spline shaft can control the transverse motion of the holder member along the arm assembly independent of the forward-backward motion or position of the arm assembly.

By providing a plurality of such base units and equipping each with one or more item-handling modules of different kinds such as an elevator, a tube feeder and an automatic surface mounter, it is possible to form a versatile automatic loading-unloading system relatively inexpensively which can perform desired kinds of loading and unloading jobs.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a perspective view of a base unit embodying the present invention,

FIG. 2 is a plan view of a part of the driver assembly of the base unit of FIG. 1, FIG. 3 is a side view of a part of the driver assembly of the base unit of FIGS, 1 and 2, FIG. 4 is a sectional front view of a part of the driver assembly and a part of the arm assembly of the base unit of FIGS. 1-3 taken along the line 4—4 of FIG. 3, FIG. 5 is a back view of a portion of the driver assembly showing the motor for rotating the spline shaft, FIG. 6 is a back view of the internal structure of a part of the arm assembly and the holder means supporting a pick-up module mounted thereon, FIG. 7 is a sectional view taken along the line 7—7 of FIG. 6, and FIG. 8 is a perspective view of the base unit of FIG. 1 with different item-handling modules attached thereto.

DETAILED DESCRIPTION OF HE INVENTION

As outlined above, a system embodying the present invention is comprised of a plurality of units, all having a same basic structure (referred to as the base unit) and each provided with one or more item handling modules of different kinds. The description of the present invention which is to follow, therefore, starts with that of a base unit.

As shown in FIG. 1, a base unit 10 according to a preferred embodiment of the present invention is comprised essentially of a unistructurally cast substantially rectangular frame-like top plate 20 of an aluminum material and what may be hereinafter referred to as a controller module 21 and a stand module 22. The controller module 21 and the stand modules 22 are attached to the planar piece 20 from below and serve respectively as a left-hand leg and a right-hand leg of the unit, supporting the top plate 20 horizontally thereupon. The controller module 21 is so referred to because it contains therein control devices such as a computer (not shown) for controlling the automated operations and movements of various parts of the unit to be described below.

Numerals 25 indicate casters and numerals 26 indicate leveling pads of known kinds.

With reference still to FIG. 1, numeral 30 indicates an arm assembly which is adapted to move in the forward-backward direction indicated by the doubleheaded arrow A over the upper surface of the top plate 20 while remaining horizontal and extended in the transverse direction (perpendicular to the aforementioned forward-backward direction). Although hidden behind the arm assembly 30 and hence not visible in FIG. 1, there is what is herein referred to as a holder member mounted onto the arm assembly 30 so as to be slidable therealong in the transverse direction. The means for driving the arm assembly 30 in the forward-backward direction over the top plate 20 and the holder member transversely on and along the arm assembly 30 are herein referred to as a driver assembly 40. The driver assembly 40, however, is not visible in FIG. 1 because they are hidden under a left-hand cover piece 27 and a righthand cover piece 28. Numeral 29 indicates the transparent top cover piece. In what follows, the driver assembly for the base unit 10 is described in detail.

With reference simultaneously next to FIGS. 2 and 3 which both show only essential parts of the driver assembly 40 under the left-hand cover piece 27 for the explanation of the motion of the arm assembly 30, there is provided an elongated straight rail 41 fastened to the upper surface of the top plate 20 and extending in the forward-backward direction. Numeral 31 indicates what is herein referred to as the end structure, which is a structure at the left-hand end of the arm assembly 30 not visible in FIG. 1 because it is under the left-hand cover piece 27. The end structure 31 has on its bottom an engaging piece 32 adapted to engagingly hug the rail 41 as shown more clearly in FIG. 4. Although not separately shown, there is another elongated straight rail under the right-hand cover piece 28, also fastened to the upper surface of the top plate 20 and extending in the forward-backward direction. The right-hand end of the arm assembly 30 is also provided with an engaging piece which similarly engages with this rail such that the arm assembly 30 can slide in the forward-backward direction on and along these rails 41, guided by these engaging pieces 32, while maintaining its transverse direction as shown in FIG. 1.

In order to effect this forward-backward motion of the arm assembly 30 on and along these rails 41, a belt 42 is attached to the end structure 31 by means of clamps (like those shown at 33 in FIG. 7 to be explained below). and is passed over a plurality of rollers 43. One of these rollers 43 is mounted on a shaft which is in a power-communicating relationship with a motor 44 attached to the top plate 20 as shown in FIG. 3. In FIGS. 2, 3 and 4, numeral 45 indicates a spline shaft having longitudinally extending grooves between outwardly protruding, evenly spaced keys. This spline shaft 45 extends in the forward-backward direction and is rotatably supported by the top plate 20, penetrating the arm assembly 30 through its end structure 31. As shown in FIG. 5, another motor 46 for thus rotating the spline shaft 45 is attached to the lower surface of the top plate 20 and its motion is communicated to the spline shaft 45 through a pulley-and-belt system of a known type.

With reference next to FIGS. 6 and 7, the arm assembly 30 has a horizontally and transversely extending rail 34 affixed to its vertical surface and a holder member 35 hugs and engages with this rail 34 so as to be supported thereby and be able to slide horizontally therealong. In order to effect this transverse motion of the holder member 35 along the rail 34, a transversely extending belt 36 is attached by clamps 33 to the holder member 35 as shown in FIG. 6. This transversely extending belt 36 is engagingly passed around a pulley which engages with the spline shaft 45 so as to rotate with it while being able to slide longitudinally in the forward-backward direction therealong. Thus, the rotary motion of the spline shaft 45 around its own axis is communicated to the belt 36, moving it transversely along the rail 34. In FIG. 6, numeral 37 indicates another pulley distal from the end structure 31 over which the belt 36 is also passed around. With the driver assembly 40 thus structured, the arm assembly 30 can be moved in the forward-backward direction as explained above, its end structure 31 sliding along the rails 41 independently of whether the spline shaft 45 is rotating or not. In other words, the forward-backward motion of the arm assembly 30 and the rotary motion of the spline shaft 45 therethrough can be effected simultaneously and independently of each other by the two motors 44 and 46 which are both affixed to the top plate 20.

The holder member 35 is so referred to because it is adapted to have an item-handling module of different kinds attached thereonto. FIGS. 6 and 7 show the holder member 35 supporting a vacuum pick-up module 50 as an example of such item-handling modules. The vacuum pick-up module 50 is for lifting up small items such as ICs. According to the embodiment shown in FIGS. 6 and 7, the vacuum pick-up module 50 has four vertically oriented tubes 51 with downwardly facing openings. Numerals 52 and 53 indicates an air cylinder and an air manifold individually associated with the tubes 51. Wires 54 for delivering electrical signals for the operation of the vacuum pick-up module 50 are extended longitudinally along the arm assembly 30 and are connected to a vacuum control unit 55 (FIG. 3) affixed to the end structure 31 of the arm assembly 30 and from there to the control device in the controller module 21.

In summary, with the arm assembly 30 supporting the vacuum pick-up module 50 and the driver assembly 40 as structured above, the tubes 51 of the vacuum pickup module 50 can be controllably moved freely in a two-dimensional plane above the top plate 20 from any position to a specified new position by operating the two motors 44 and 46. In other words, a small object like an IC at an initial position on the top plate 20 can be picked up and delivered to another position if these two positions are specified through the controlling device in the controller module 21 so as to control the operations of these motors 44 and 46.

As shown in FIG. 1, the inwardly facing vertical surface of the left-hand cover piece 27 is provided with a horizontally elongated window such that the arm assembly 30 with its end structure 31 inside this cover piece 27 can move in the forward-backward direction as explained above. Although not visible in FIG. 1, the inwardly facing vertical surface of the right-hand cover piece 28 is also provided with a similar window for the same reason. In order to protect the components under these cover pieces 27 and 28 from dust and other material particles, each of these windows is covered with a tape-like curtain 47 which is attached to the end structure 31 and passed around a set of rollers 48 rotatably supported around vertical axes. As the arm assembly 30 is moved in the forward-backward direction, the curtain 47 moves therewith around these rollers 48, thereby keeping the window in a covered condition and protecting the components of the driver assembly 40.

It now goes without saying that a large variety of item-handling modules can be attached to a base unit as described above, depending upon the kind of loading and unloading operations desired. FIG. 8 shows only a few examples of such modules and the manners in which they may be attached. Since these modules are not intended, by or of themselves, a part of the present invention, they will be described herein only to show how they can be used in connection with the base unit 10 of the present invention.

In FIG. 8, numeral 60 indicates a tray elevator module by which a tray 61 or the like for carrying items such as ICs can be vertically transported to or from the upper surface of the top plate 10. For this reason, the top plate 20 is formed with an opening with a removable top cover plate 49 (as shown in FIG. 2) or plates and the elevator 60 is attached to the bottom surface of the top plate 10 such that the tray 61, as it is brought upward from below, can pass through the opening to the height of the upper surface of the top plate 20. The arm assembly 30 and the spline shaft 45 can then be operated such that the vacuum pick-up module 50 can sequentially pick up the ICs or the like from the tray 61.

Numeral 70 indicates a tube feeder comprising a plurality of tubular members through which items to be delivered sequentially such as ICs are caused to slide down. The tube feeder 70 may be attached to the front side surface of the top plate 20 as shown in FIG. 8. If the items from the tube feeder 70 are to be loaded into a tray, the top cover sheet is placed over the opening in the top plate 20. Numeral 80 indicates a so-called test and burn-in board for testing the performance of ICs under severe temperature and humidity conditions. For transferring ICs from a tray to a burn-in board, for example, both the tray and the burn-in board are placed on top of the top plate 20 and the motors 44 and 46 as well as the vacuum pick-up module 50 are so operated that the ICs are sequentially picked up from their known initial positions in the tray to their designated target positions in the burn-in board.

In summary, a user such as an IC manufacturer may purchase a plurality of base units having the same common structure and equip each of them with a different set of item-handling modules, depending upon what kinds of loading and unloading operations are required. This is a more inexpensive way of providing an automatic loading-unloading system especially where, as in the fabrication of ICs, many different kinds of vehicles are involved and hence different methods of loading and unloading must be utilized.

What is claimed is:

1. A modular unit for automatically loading and unloading items from a first container to a second container, said unit comprising a unistructurally cast planar top plate having an opening and a removable top cover plate which can cover said opening, an elevator attached to said top plate for vertically transporting items to and from the top surface of said top plate, a controlling module and a stand module both attached to said to plate from below and distal from each other so as to together support said topplate horizontally, an elongated arm assembly which extends horizontally in a transverse direction above said top plate, a holder member which is mounted to said arm assembly and slidable in said transverse direction therealong, and a driver assembly for causing said elongated arm to move in a forward-backward direction perpendicular to said transverse direction and said holder member to move along said arm assembly, said driver assembly including a longitudinal rails which are fastened to said top plate and extend in said forward-backward direction, said arm assembly having an end structure which slidably engages with one of aid longitudinal rails, an elongated spline shaft extending in said forward-backward direction and rotatably supported by said top plate, a first motor affixed to said top plate, a first power-communicating means for communicating the power of said first motor to said end structure to thereby cause said arm assembly to move slidingly in said forward-backward direction along said longitudinal rails, a second motor affixed to said top plate for causing said spline shaft to rotate, and a secondpower-communicating means mounted to said arm assembly for communicating the rotary motion of said spline shaft to said shoulder member to thereby cause said holder member to slidingly move in said transverse direction along said arm assembly, said controlling module containing control means for controlling the operation of said first motor and said second motor according to a user-specified program.

2. The unit claim 1 wherein said first power communicating means includes arm-driving pulleys and an arm-driving belt stretched thereover and extending generally in aid forward-backward direction, a part of said arm-driving belt being fastened to an end part of said arm assembly, said first motor being in power-communicating relationship with the shaft of one of said arm-driving pulleys.

3. The unit of claim 1 wherein said spline shaft penetrates said end structure such that said end structure slides along said spline shaft when said arm assembly is caused to move in aid forward-backward direction over said top plate.

4. The unit of claim 1 further comprising
   a cover piece which is elongated in said forward-backward direction and is attachable to said top plate so as to cover a portion of said driver assembly including one of said longitudinal rails, said end structure and said spline shaft, said cover piece having a window which is elongated in said forward-backward direction, said arm assembly penetrating said window, a curtain means attached to said end structure and covering said window, and a set of curtain-holding rollers having vertical axes, said curtain means being stretched around said curtain-holding rollers so as to keep covering said window by moving around said curtain-holding rollers as said arm assembly is moved in said forward-backward direction.

5. The unit of claim 1 wherein said arm assembly includes a transverse rail extending horizontally in said transverse direction, said holder member slidably engaging with said transverse rail.

6. The unit of claim 1 further comprising a vacuum pick-up module for lifting up items, said vacuum pick-up module having vacuum generating means and tubular members with downwardly facing openings, said vacuum pick-up module being detachably attached to said holder member.

7. A system for automatically loading and unloading items into and from containers of different types having various configurations, said system comprising a plurality of unis, each of said units comprising a unistructurally cast planar top plate, a controlling module and a stand module both attached to said top plate from below and distal from each other so as to together support said top plate horizontally, an elongated arm assembly which extends horizontally in a transverse direction above said top plate, a holder member which is mounted to said arm assembly and slidable in said transverse direction therealong, and a driver assembly for causing said elongated arm to move in a forward-backward direction perpendicular to said transverse direction and said holder member to move along said arm assembly, said driver assembly including longitudinal rials which are fastened to said top plate and extend in said forward-backward direction, said arm assembly having an end structure which slidably engages with one of said longitudinal rails, an elongated spline shaft extending in said forward-backward direction and rotatably supported by said top plate, a first motor affixed to aid top plate, a first power-communicating means for communicating the power of said fist motor to said end structure to thereby cause said arm assembly to move slidingly in said forward-backward direction along said longitudinal rails, a second motor affixed to said top plate for causing said spline shaft to rotate, and a second power-communicating means mounted to said arm assembly for communicating the rotary motion of said spline shaft to said holder member to thereby cause said holder member to slidingly move in said transverse direction a long said arm assembly, said controlling module containing control means for controlling the operation of said first motor and said second motor according o a user-specified program, at lest one of said units further comprising a vacuum pick-up module for lifting up items, said vacuum pick-up module having vacuum generating means and tubular members with downwardly facing openings, said vacuum pick-up module being detachably attached to said holder member, said top plate of at least one of said units being formed with an opening, having a removable top cover plate which can cover said opening and having detachably attached thereto an elevator for vertically transporting items to and from he top surface of said top plate.

8. A modular unti for automatically loading and unloading items from a first container to a second container, said unit comprising a unistructurally cast planar top plate, a controlling module and stand module both attached to said top plate from below and distal from each other so as to together support said top plate horizontally, an elongated arm assembly which extends horizontally in a transverse direction above said top plate, a holder member which is mounted to said arm assembly and slidable in aid transverse direction therealong, and a driver assembly for causing said elongated arm to move in a forward-backward direction perpendicular to said transverse direction and said holder member to move along said arm assembly, said driver assembly including longitudinal rails which are fastened to said top plate and extend in said forward-backward direction, said arm assembly having an end structure which slidably engages with one of said longitudinal rails, an elongated spline shaft extending in said forward-backward direction and rotatably supported by said top plate, a fist motor affixed to said top plate, a fist power-communicating means for communicating the power of said first motor to said end structure to thereby cause said arm assembly to move slidingly in said forward-backward direction along said longitudinal rails, a second motor affixed to said top plate for causing said spline shaft to rotate, a secondpower-communicating means mounted to said arm assembly for communicating the eotoary motion of said spline shaft to said holder member to thereby cause said holder member to slidingly move in said transverse direction along said arm assembly, said controlling module containing control means for controlling the operation of said first motor and said second motor according to a user-specified program, a cover piece which is elongated in said forward-backward direction and is attachable to said top plate so as to cover a potion of said driver assembly including one of said longitudinal rails, said end structure and said spline shaft, said cover piece having a window which is elongated in said forward-backward direction, said arm assembly penetrating said window, a curtain means attached to said end structure and covering said window, and a set of curtain-holding rollers having vertical axes, said curtain means being stretched around said curtain-holding rollers so as to keep covering said window by moving around said curtain-holding rollers as said arm assembly is moved in said forward-backward direction.

* * * * *